US 6,717,185 B2

(12) United States Patent
Edmond et al.

(10) Patent No.: US 6,717,185 B2
(45) Date of Patent: Apr. 6, 2004

(54) LIGHT EMITTING DEVICES WITH GROUP III NITRIDE CONTACT LAYER AND SUPERLATTICE

(75) Inventors: John Adam Edmond, Cary, NC (US); Kathleen Marie Doverspike, Cary, NC (US); Hua-shuang Kong, Raleigh, NC (US); Michael John Bergmann, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/376,494

(22) Filed: Mar. 1, 2003

(65) Prior Publication Data
US 2003/0164506 A1 Sep. 4, 2003

Related U.S. Application Data

(62) Division of application No. 09/706,057, filed on Nov. 3, 2000, now Pat. No. 6,534,797.

(51) Int. Cl.$^7$ ............................................ H01L 29/205
(52) U.S. Cl. ...................... 257/97; 257/103; 257/201
(58) Field of Search ........................... 257/97, 103, 201

(56) References Cited

U.S. PATENT DOCUMENTS

| 5,173,751 A | 12/1992 | Ota et al. |
| 5,247,533 A | 9/1993 | Okazaki et al. |
| 5,338,944 A | 8/1994 | Edmond et al. |

(List continued on next page.)

FOREIGN PATENT DOCUMENTS

| EP | 0 817 283 A1 | 1/1998 |
| GB | 2 343 294 A | 5/2000 |
| WO | WO 99/18617 A1 | 4/1999 |

OTHER PUBLICATIONS

Kubota, et al; "Preparation and properties of III–V nitride thin films"; J. Appl. Phys. 66(7); Oct. 1, 1989; pp. 2984–2988.

Chan, et al.; "Metallization of GaN Thin Films Prepared by Ion Beam Assisted Molecular Beam Epitaxy"; Materials Research Society Symposium Proc. vol. 339; 1994; pp. 223–227.

Lin, et al.; "Low resistance ohmic contacts on wide band–gap GaN"; Appl. Phys. Lett. 64(8); Feb. 21, 1994; pp. 1003–1005.

Wright, et al.; "First–principles calculations for zinc–blende AlInN alloys"; Appl. Phys. Lett. 66(25); Jun. 19, 1995; pp. 3465–3467.

Sakai, et al; "GaN/GaIn/GaN Double Heterostructure Light Emitting Diode Fabricated Using Plasma–Assisted Molecular Beam Epitaxy"; Jpn. Appl. Phys. vol. 34; pp. 1429–1430.

McIntosh, et al; "Growth and characterization of AlInGaN quaternary alloys"; Appl. Phys. Lett. 68(1); Jan. 1, 1996; pp. 40–42.

(List continued on next page.)

Primary Examiner—Jerome Jackson
(74) Attorney, Agent, or Firm—Summa & Allan, P.A.

(57) ABSTRACT

The present invention is a semiconductor structure for light emitting devices that can emit in the red to ultraviolet portion of the electromagnetic spectrum. The semiconductor structure includes a first cladding layer of a Group III nitride, a second cladding layer of a Group III nitride, and an active layer of a Group III nitride that is positioned between the first and second cladding layers, and whose bandgap is smaller than the respective bandgaps of the first and second cladding layers. The semiconductor structure is characterized by the absence of gallium in one or more of these structural layers.

25 Claims, 4 Drawing Sheets

U.S. PATENT DOCUMENTS

| | | |
|---|---|---|
| 5,387,804 A | 2/1995 | Suzuki et al. |
| 5,408,120 A | 4/1995 | Manabe et al. |
| 5,523,589 A | 6/1996 | Edmond et al. |
| 5,585,648 A | 12/1996 | Tischler |
| 5,592,501 A | 1/1997 | Edmond et al. |
| 5,631,190 A | 5/1997 | Negley |
| 5,661,074 A | 8/1997 | Tischler |
| 5,670,798 A | 9/1997 | Schetzina |
| 5,739,554 A | 4/1998 | Edmond et al. |
| 5,747,832 A | 5/1998 | Nakamura et al. |
| 5,751,752 A | 5/1998 | Shakuda |
| 5,862,167 A | 1/1999 | Sassa et al. |
| 5,874,747 A | 2/1999 | Redwing et al. |
| 5,880,491 A | 3/1999 | Soref et al. |
| 5,900,647 A | 5/1999 | Inoguchi |
| 5,987,048 A | 11/1999 | Ishikawa et al. |
| 6,028,877 A | 2/2000 | Kimura |
| 6,046,464 A | 4/2000 | Schetzina |
| 6,067,310 A | 5/2000 | Hashimoto et al. |
| RE36,747 E | 6/2000 | Manabe et al. |
| 6,072,189 A | 6/2000 | Duggan |
| 6,072,819 A | 6/2000 | Shakuda |
| 6,078,064 A | 6/2000 | Ming-Jiunn et al. |
| 6,084,899 A | 7/2000 | Shakuda |
| 6,118,801 A | 9/2000 | Ishikawa et al. |
| 6,479,836 B1 * | 11/2002 | Suzuki et al. ............... 257/15 |

OTHER PUBLICATIONS

Mack; "Characteristics of Indium–Gallium–Nitride Multiple–Quantum–Well Blue Laser Diodes Grown by MOCVD"; MRS Internet Journal of Nitride Semiconductor Research; vol. 2, Article 41; 1997.

Matsuoka; "Calculation of unstable mixing region in wurtzite $In_{1-x-y} Ga_x Al_y N$"; Appl. Phys. Lett. 71(1); Jul. 7, 1997, pp. 105–106.

Monemar, et al; "Radiative recombination in In 0.15 Ga 0.85 N/GaN multiple quantum well structures"; MRS Internet Journal Nitride Semiconductor Research; 1999.

Kariya, et al; "Mosaic Structure of Ternary $Al_{1-x} In_x N$ Films on GaN Grown by Metalorganic Vapor Phase Epitaxy"; Jpn. Appl. Phys. vol. 38; 1999; pp. 984–986.

Kariya, et al; "Structural characteristion of $Al_{1-x} In_x N$ lattice–matched to GaN"; Journal of Crystal Growth 209; 2000; pp. 419–423.

Kariya, et al; "Structural Properties of $Al_{1-x} In_x N$ Ternary Alloys on GaN Grown by Metalorganic Vapor Phase Epitaxy"; Jpn. Appl. Phys., vol. 37; 1998; pp. 697–699.

Yamaguchi, et al; "Anomalous features in the optical properties of $Al_{1-x} In_x N$ on GaN grown by metal organic vapor phase epitaxy"; Applied Physics Letters, vol. 76(7); Feb. 14, 2000; pp. 876–878.

* cited by examiner

| 12—second cladding layer |
| --- |
| 13—active layer |
| 11—first cladding layer |
| 24—transition layer |
| 23—conductive buffer layer |
| 17—silicon carbide substrate |

| 12—second cladding layer |
| --- |
| 13—active layer |
| 11—first cladding layer |
| 28—discrete crystal portions |
| 17—silicon carbide substrate |

LIGHT EMITTING DEVICES WITH GROUP III NITRIDE CONTACT LAYER AND SUPERLATTICE

CROSS-REFERENCE TO RELATED APPLICATION

This application is a division of U.S. application Ser. No. 09/706,057, filed Nov. 3, 2000 now U.S. Pat. No. 6,534,797.

FIELD OF THE INVENTION

The present invention relates to semiconductor structures of light emitting devices, particularly light emitting diodes and laser diodes formed from Group III nitrides, which are capable of emitting light in the red to ultraviolet portions of the electromagnetic spectrum.

BACKGROUND OF THE INVENTION

Photonic semiconductor devices fall into three categories: devices that convert electrical energy into optical radiation (e.g., light emitting diodes and laser diodes); devices that detect optical signals (e.g., photodetectors); and devices that convert optical radiation into electrical energy (e.g., photovoltaic devices and solar cells). Although all three kinds of devices have useful applications, the light emitting diode may be the most commonly recognized because of its application to various consumer products and applications.

Light emitting devices (e.g., light emitting diodes and laser diodes), herein referred to as LEDs, are photonic, p-n junction semiconductor devices that convert electrical power into emitted light. Perhaps most commonly, LEDs form the light source in the visible portion of the electromagnetic spectrum for various signals, indicators, gauges, and displays used in many consumer products (e.g., audio systems, automobiles, household electronics, and computer systems). LEDs are desirable as light output devices because of their generally long lifetime, their low power requirements, and their high reliability.

Despite widespread use, LEDs are somewhat functionally constrained, because the color that a given LED can produce is limited by the nature of the semiconductor material used to fabricate the LED. As well known to those of ordinary skill in this and related arts, the light produced by an LED is referred to as "electroluminescence," which represents the generation of light by an electric current passing through a material under an applied voltage. Any particular composition that produces electroluminescent light tends to do so over a relatively narrow range of wavelengths.

The wavelength of light (i.e., its color) that can be emitted by a given LED material is limited by the physical characteristics of that material, specifically its bandgap energy. Bandgap energy is the amount of energy that separates a lower-energy valence band and a higher energy conduction band in a semiconductor. The bands are energy states in which carriers (i.e., electrons or holes) can reside in accordance with well-known principles of quantum mechanics. The "band gap" is a range of energies between the conduction and valence bands that are forbidden to the carriers (i.e., the carriers cannot exist in these energy states). Under certain circumstances, when electrons and holes cross the bandgap and recombine, they will emit energy in the form of light. In other words, the frequency of electromagnetic radiation (i.e., the color) that can be produced by a given semiconductor material is a function of that material's bandgap energy.

In this regard, narrower bandgaps produce lower energy, longer wavelength photons. Conversely, wider bandgap materials produce higher energy, shorter wavelength photons. Blue light has a shorter wavelength—and thus a higher frequency—than the other colors in the visible spectrum. Consequently, blue light must be produced from transitions that are greater in energy than those transitions that produce green, yellow, orange, or red light. Producing photons that have wavelengths in the blue or ultraviolet portions of the visible spectrum requires semiconductor materials that have relatively large bandgaps.

The entire visible spectrum runs from the violet at or about 390 nanometers to the red at about 780 nanometers. In turn, the blue portion of the visible spectrum can be considered to extend between the wavelengths of about 425 and 480 nanometers. The wavelengths of about 425 nanometers (near violet) and 480 nanometers (near green) in turn represent energy transitions of about 2.9 eV and about 2.6 eV, respectively. Accordingly, only a material with a bandgap of at least about 2.6 eV can produce blue light.

Shorter wavelength devices offer a number of advantages in addition to color. In particular, when used in optical storage and memory devices, such as CD-ROM optical disks, shorter wavelengths enable such storage devices to hold significantly more information. For example, an optical device storing information using blue light can hold substantially more information in the same space as one using red light.

The basic mechanisms by which light-emitting diodes operate are well understood in this art and are set forth, for example, by Sze, *Physics of Semiconductor Devices,* 2d Edition (1981) at pages 681–703.

The common assignee of the present patent application was the first in this field to successfully develop commercially viable LEDs that emitted light in the blue color spectrum and that were available in large, commercial quantities. These LEDs were formed in silicon carbide, a wide-bandgap semiconductor material. Examples of such blue LEDs are described in U.S. Pat. Nos. 4,918,497 and 5,027,168 to Edmond each titled "Blue Light Emitting Diode Formed in Silicon Carbide." Other examples of Group III nitride LED structures and laser structures are described in commonly assigned U.S. Pat. Nos. 5,523,589; 5,592,501; and 5,739,554.

In addition to silicon carbide, candidate materials for blue light emitting devices are gallium nitride (GaN) and its associated Group III (i.e., Group III of the periodic table) nitride compounds such as aluminum gallium nitride (AlGaN), indium gallium nitride (InGaN), and in some circumstances aluminum indium gallium nitride (AlInGaN). These materials are particularly attractive because they offer direct energy transitions with bandgaps between about 1.9 to about 6.2 eV at room temperature. More common semiconductor materials such as silicon, gallium phosphide, or gallium arsenide are unsuitable for producing blue light because their bandgaps are approximately 2.26 eV or less, and in the case of silicon, are indirect semiconductors and inefficient light emitters.

As known to those familiar with LEDs and electronic transitions, a direct transition occurs in a semiconductor when the valence band maxima and the conduction band minima have the same momentum state. This means that crystal momentum is readily conserved during recombination of electrons and holes so that the energy produced by the transition can go predominantly and efficiently into the photon, (i.e., to produce light rather than heat). When the conduction band minimum and valence band maximum do not have the same momentum state, a phonon (i.e., a quantum of vibrational energy) is required to conserve crystal momentum and the transition is called "indirect." The necessity of a third particle, the phonon, makes indirect radiative transitions less likely, thereby reducing the light emitting efficiency of the device.

Generally speaking, an LED formed in a direct bandgap material will perform more efficiently than one formed in an indirect bandgap material. Therefore, the direct transition characteristics of Group III nitrides offer the potential for brighter and more efficient emissions—and thus brighter and more efficient LEDs—than do the emissions from indirect materials such as silicon carbide. Accordingly, much interest in the last decade has also focused on producing light emitting diodes in gallium nitride and related Group III nitrides.

Although Group III nitrides offer a direct transition over a wide bandgap energy range, the material presents a particular set of technical manufacturing problems. In particular, no commercially-viable technique has yet emerged for producing bulk single crystals of gallium nitride (GaN) that are capable of functioning as appropriate substrates for the gallium nitride epitaxial layers on which photonic devices would be formed.

All semiconductor devices require some kind of structural substrate. Typically, a substrate formed of the same material as the active region offers significant advantages, particularly in crystal growth and lattice matching. Because gallium nitride has yet to be formed in such bulk crystals, gallium nitride photonic devices must be formed in epitaxial layers on non-GaN substrates.

Recent work in the field of Group III nitride substrates includes copending and commonly assigned U.S. patent applications Ser. No. 09/361,945, filed Jul. 27, 1999, for "Growth of Bulk Single Crystals of Aluminum Nitride;" Ser. No. 09/361,944 filed Jul. 27, 1999, for "Growth of Bulk Single Crystals of Aluminum Nitride from a Melt;" Ser. No. 09/111,413 filed Jul. 7, 1999, for "Growth of Bulk Single Crystals of Aluminum Nitride;" and Ser. No. 09/169,385 filed Oct. 9, 1998, for "Growth of Bulk Single Crystals of Aluminum Nitride: Silicon Carbide Alloys." All of these pending applications are incorporated entirely herein by reference.

Using different substrates, however, causes an additional set of problems, mostly in the area of crystal lattice matching. In nearly all cases, different materials have different crystal lattice parameters. As a result, when a gallium nitride epitaxial layer is grown on a different substrate, some crystal lattice mismatching and thermal expansion coefficient mismatching will occur. The resulting epitaxial layer is referred to as being "strained" by this mismatch. Crystal lattice mismatches, and the strain they produce, introduce the potential for crystal defects. This, in turn, affects the electronic characteristics of the crystals and the junctions, and thus tends to degrade the performance of the photonic device. These kinds of defects are even more problematic in high power structures.

In early Group III nitride LEDs, the most common substrate for gallium nitride devices was sapphire (i.e., aluminum oxide $Al_2O_3$). Certain contemporary Group III nitride devices continue to use it.

Sapphire is optically transparent in the visible and ultraviolet ranges, but has a crystal lattice mismatch with gallium nitride of about 16 percent. Furthermore, sapphire is insulating rather than conductive, and is unsuitable for conductivity doping. Consequently, the electric current that must be passed through an LED to generate the light emission cannot be directed through a sapphire substrate. Thus, other types of connections to the LED must be made.

In general, LEDs with vertical geometry use conductive substrates so that ohmic contacts can be placed at opposite ends of the device. Such vertical LEDs are preferred for a number of reasons, including their easier manufacture and more simple incorporation into end-use devices than non-vertical devices. In the absence of a conductive substrate, however, vertical devices cannot be formed.

In contrast with sapphire, gallium nitride only has a lattice mismatch of about 2.4 percent with aluminum nitride (AlN) and mismatch of about 3.5 percent with silicon carbide. Silicon carbide has a somewhat lesser mismatch of only about 1 percent with aluminum nitride.

Group III ternary and quaternary nitrides (e.g., indium gallium nitride and aluminum indium gallium nitride) have also been shown to have relatively wide bandgaps. Accordingly, such Group III nitrides also offer the potential for blue and ultraviolet semiconductor lasers and LEDs. Most of these compounds, however, present the same problems as gallium nitride, namely the lack of an identical single crystal substrate. Thus, each is typically used in the form of epitaxial layers grown on different substrates. This presents the same potential for crystal defects and associated electronic problems.

Accordingly, the assignee of the present invention has developed the use of silicon carbide substrates for gallium nitride and other Group III devices as a means of solving the conductivity problems of sapphire as a substrate. Because silicon carbide can be doped conductively, vertical LEDs can be formed. As noted, a vertical structure facilitates both the manufacture of LEDs and their incorporation into circuits and end-use devices.

As known to those familiar with Group III nitrides, their properties differ based on the identity and mole fraction of the present Group III elements (e.g., gallium, aluminum, indium). For example, increasing the mole fraction of aluminum tends to increase the bandgap, while decreasing the amount of aluminum tends to increase the refractive index. Similarly, a larger proportion of indium will decrease the bandgap of the material, thus permitting the bandgap to be adjusted or "tuned" to produce photons of desired frequencies. This, however, tends to reduce the chemical and physical stability of the crystal. Other effects based on mole fraction include changes in crystal lattice spacing resulting in strain effects.

Accordingly, and despite much effort in this area, a need still exists for devices that incorporate vertical geometry, and that take advantage of the characteristics that result when the proportions of indium, aluminum, and gallium are desirably adjusted in the active layers, cladding layers, and buffer layers of Group III nitride photonic devices.

OBJECT AND SUMMARY OF THE INVENTION

Therefore, it is an object of the present invention to produce light emitting diodes and laser diodes from Group III nitrides in a manner that takes advantage of their favorable properties.

The invention meets this object via a semiconductor structure that includes a first cladding layer of a Group III nitride, a second cladding layer of a Group III nitride, and an active layer of a Group III nitride that is positioned between the first and second cladding layers, and whose bandgap is smaller than the respective bandgaps of the first and second cladding layers. In particular, the semiconductor structure is characterized by the absence of gallium in at least one of the active or cladding layers.

The foregoing, as well as other objectives and advantages of the invention and the manner in which the same are accomplished, is further specified within the following detailed description and its accompanying drawings.

DETAILED DESCRIPTION

Figure 1:
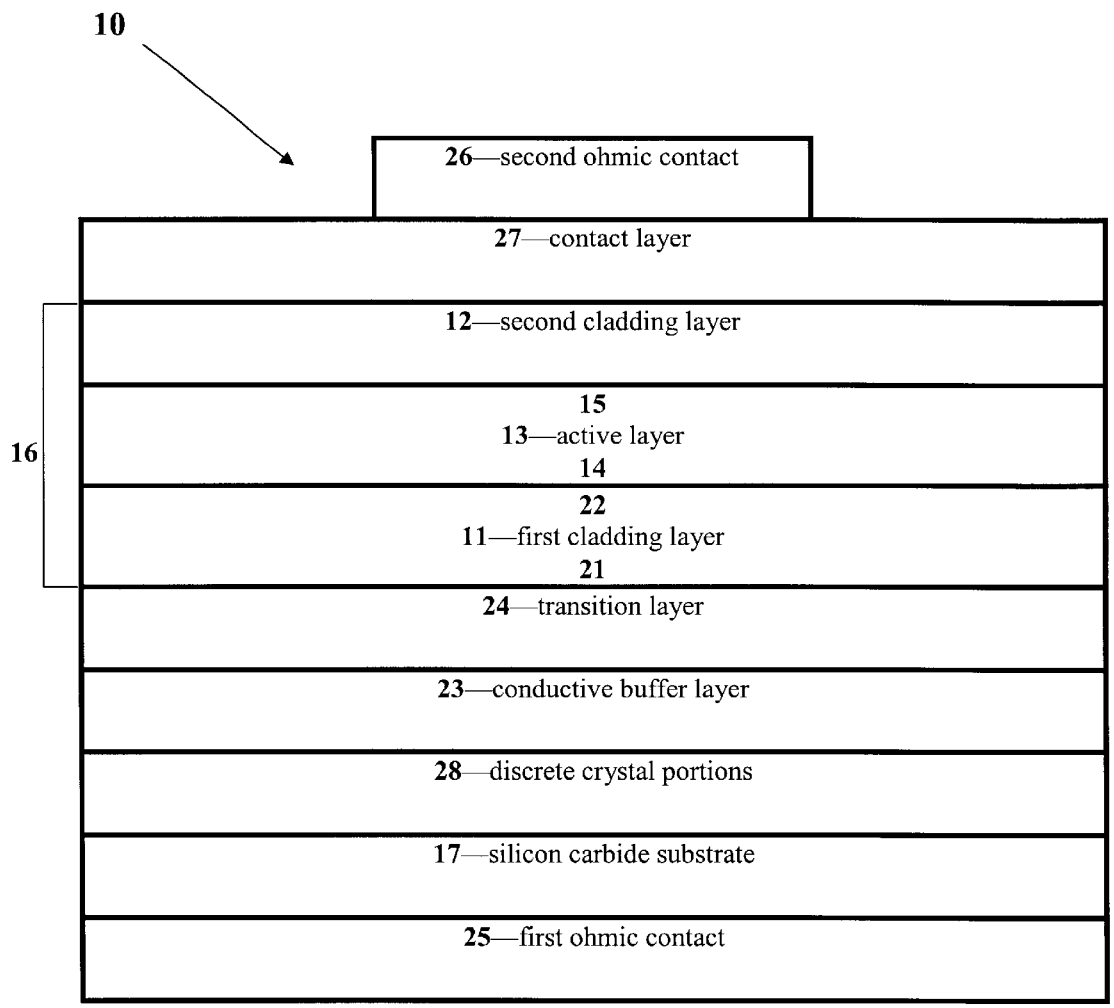
FIG. 1 is a cross-sectional schematic view of a semiconductor structure for a light emitting device according to the present invention.

The present invention is a semiconductor structure for light emitting devices that can emit in the red to ultraviolet portion of the electromagnetic spectrum. The structure includes a Group III nitride active layer positioned between a first Group III nitride cladding layer and a second Group III nitride cladding layer. The active layer has a bandgap that is smaller than each respective bandgap of the first and second cladding layers, and the first and second cladding layers preferably possess opposite conductivity types (i.e., p-type or n-type, or vice-versa). In particular, at least one of the active layers, first cladding layer, or second cladding layer is characterized by the absence of gallium.

As used herein, this means that gallium may be present, but only in amounts that are so small as to be meaningless in the context of the invention (i.e., having no functional effect on the semiconductor device). It will be understood that the requirement that at least one of the aforementioned layers exclude all but trace amounts of gallium nonetheless permits more than one layer to be so characterized (e.g., both the first cladding layer and second cladding layer may be characterized by the absence of gallium).

A particular conductivity type (i.e., n-type or p-type) may be inherent, but is more commonly a result of specifically doping the Group III nitrides using the appropriate donor or acceptor atoms. Appropriate doping of Group III nitrides is generally well understood in the art and will not be further discussed herein other than as necessary to describe the invention.

As will be understood by those having ordinary skill in the art, the molar fraction of aluminum, indium, and gallium in the active layer, the first cladding layer, and the second cladding layer may be generally expressed by the formula, $Al_xIn_yGa_{1-x-y}N$, where $0 \leq x \leq 1$ and $0 \leq y \leq 1$ and $(x+y) \leq 1$. In this regard, it will be understood that the relative concentrations of aluminum, indium, and gallium may vary from layer to layer.

In one preferred embodiment of the invention, the first cladding layer is a Group III nitride, most preferably aluminum indium nitride, characterized by the absence of gallium. In this regard, the molar fraction of aluminum and indium in the first cladding layer may be generally expressed by the formula, $Al_xIn_{1-x}N$, where $0<x \leq 1$. Here, the range for the variable x excludes 0, which will be understood by those skilled in the art as requiring the presence of aluminum (i.e., an aluminum nitride alloy).

Similarly, in another preferred embodiment of the invention, the active layer is a Group III nitride, namely aluminum indium nitride, characterized by the absence of gallium. In this regard, the molar fraction of aluminum and indium in the active layer may be generally expressed by the formula, $Al_xIn_{1-x}N$, where $0 \leq x<1$. Here, the range for the variable x excludes 1, which thereby requires the presence of indium.

Such a gallium-free aluminum indium nitride active layer is beneficial in that it may provide a much wider range of possible emissions (e.g., from red to ultraviolet). Furthermore, as an active layer, aluminum indium nitride may perform better than aluminum gallium nitride as localized states are induced by the indium in the aluminum indium nitride. This may enhance emission efficiency and reduces non-radiative recombination.

An understanding of the invention may be achieved with reference to FIG. 1, which is a cross-sectional schematic view of a semiconductor structure for an LED according to the present invention.

The semiconductor structure, which is generally designated at 10, includes a first cladding layer 11 of $Al_xIn_yGa_{1-x-y}N$, where $0 \leq x \leq 1$ and $0 \leq y \leq 1$ and $(x+y) \leq 1$. In a more specific embodiment, the first cladding layer 11 is gallium-free, consisting essentially of an aluminum indium nitride having the formula, $Al_xIn_{1-x}N$, where $0<x \leq 1$.

The semiconductor structure 10 also includes a second cladding layer 12 of $Al_xIn_yGa_{1-x-y}N$, where $0 \leq x \leq 1$ and $0 \leq y \leq 1$ and $(x+y) \leq 1$, or in a more specific embodiment, a gallium-free aluminum indium nitride cladding layer 12 having the formula, $Al_xIn_{1-x}N$, where $0<x \leq 1$.

As noted, the first cladding layer 11 and the second cladding layer 12 preferably have opposite conductivity types. That is, if the first cladding layer 11 is an n-type layer, then the second cladding layer 12 is a p-type layer, and vice-versa. The former embodiment is favored over the latter. This convention with respect to conductivity types is maintained throughout the specification. As is known by those familiar with light emitting devices, including structural layers of opposite conductivity types facilitates forwarding biasing of the device, which in turn promotes the recombinations that produce the desired emissions.

An active layer 13 having the formula $Al_xIn_yGa_{1-x-y}N$, where $0 \leq x \leq 1$ and $0 \leq y \leq 1$ and $(x+y) \leq 1$, is positioned between the first cladding layer 11 and the second cladding layer 12. In a more specific embodiment, the active layer 13 is gallium-free, consisting essentially of an aluminum indium nitride having the formula, $Al_xIn_{1-x}N$, where $0 \leq x<1$.

As used herein, the term "layer" generally refers to a single crystal epitaxial layer.

The active layer 13 may be either doped or undoped. As is known to those familiar with Group III nitride properties, the undoped material will generally be intrinsically n-type. In particular, the first cladding layer 11 and the second cladding layer 12 have respective bandgaps that are each larger than the bandgap of the active layer 13. As noted earlier, the Group III mole fractions can be selected to provide these characteristics.

Figure 2:
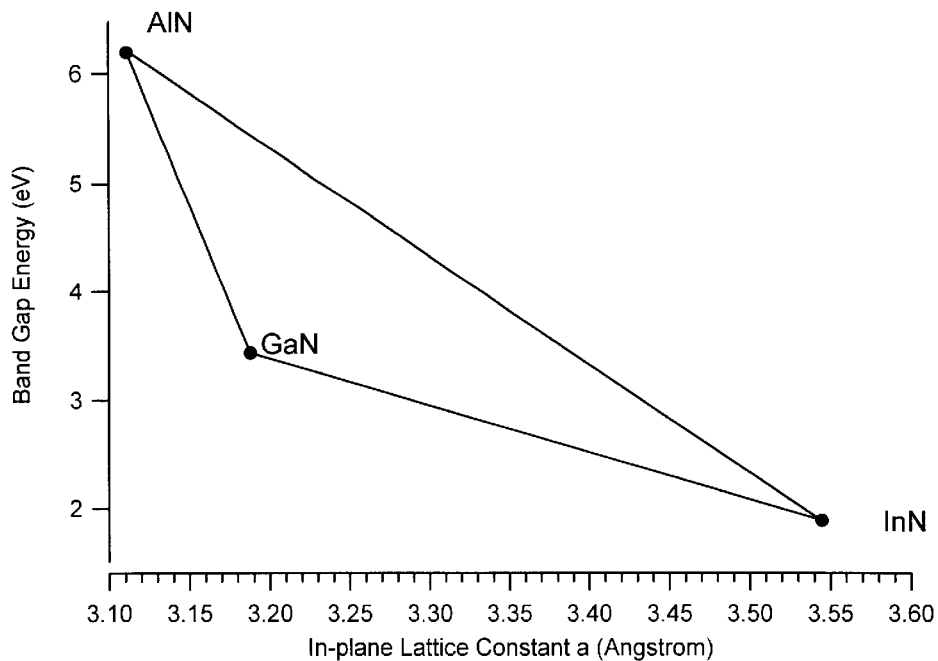
FIG. 2 is a theoretical plot of bandgap energy versus lattice parameter for Group III nitrides alloys of aluminum, indium, and gallium.

In this regard, FIG. 2 theoretically describes bandgap energy versus lattice parameter. The triangular region of FIG. 2 represents the range of bandgap energies available for Group III nitrides of aluminum, indium, and gallium. FIG. 2 reveals that for any particular lattice parameter, eliminating gallium maximizes the bandgap energy (i.e., the bandgap for an aluminum indium nitride is approximated by the AlN—InN segment).

As is also known to those familiar with semiconductor structures—especially laser structures—in order to enhance the capabilities of a device, the active layer should desirably have a lower bandgap than the adjacent cladding layers, and a higher refractive index than the adjacent cladding layers. Such a structure gives two benefits important for laser capability. First, if the active layer has the lowest bandgap, it forms a quantum well into which carriers tend to fall. This helps to enhance the laser effect. Second, waveguiding occurs in the material that has the highest refractive index in the structure. Accordingly, when the bandgap of the active layer is less than that of the adjacent layers and its refractive index is greater than that of the adjacent layers, the lasing capabilities of the device are enhanced.

Moreover, as known to those of ordinary skill in this art, the composition of ternary and quaternary Group III nitrides can affect both their refractive index and their bandgap. Generally speaking, a larger proportion of aluminum increases the bandgap and decreases the refractive index. Thus, in preferred embodiments, in order for the cladding layers 11 and 12 to have a bandgap larger than the active layer 13 and a refractive index smaller than the active layer 13, the cladding layers 11 and 12 preferably have a higher fraction of aluminum as compared to the active layer 13. The larger bandgap of the cladding layers 11 and 12 enhances the confinement of carriers to the active layer 13, thereby increasing the efficiency of the device. Similarly, the lower refractive index of the heterostructure layers 11 and 12 causes the light to be confined in the active layer 13.

As previously noted, the recited variables (e.g., x and y) refer to the structural layer they describe. That is, the value of a variable with respect to one layer is immaterial to the value of the variable with respect to another layer. For example, in describing the semiconductor structure, the variable x may have one value with respect to first cladding layer 11, another value with respect to second cladding layer 12, and yet another value with respect to active described layer 13. As will also be understood by those of ordinary skill in the art, the limitation $0 \leq (x+y) \leq 1$ in the expression $Al_xIn_yGa_{1-x-y}N$ simply requires that the Group III elements and the nitrogen to be present in a 1:1 molar ratio.

Examples 1 and 2 (below) disclose various molar ratios for the Group III nitrides in the cladding layers and the active layer. In particular, Example 1 describes a ternary $In_xAl_{1-x}N$ cladding layer composition for a blue LED, and Example 2 describes a ternary $In_xAl_{1-x}N$ active layer composition for a blue LED:

Example 1

The cladding layers for a blue LED (425 nm<$\lambda$<480 nm) must have a band-gap energy greater than that of the blue active layer (2.58–2.92 eV). For the ternary $In_xAl_{1-x}N$, the bandgap energy of the ideal crystal remains a matter of research and debate. This is primarily due to the difficulty in growing high quality, uniform epitaxial layers of the solid solution that are thick enough (approximately 0.2 $\mu$m) for optical transmission measurements to determine the bandgap energy. From current data, $In_{0.17}Al_{0.83}N$ has a bandgap energy of 2.9–3.0 eV. See S. Yamaguchi, M. Kariya, S. Nitta, T. Takeuchi, C. Wetzel, H. Amano, and I. Akasaki, Appl. Phys. Lett. 76 876 (2000). Therefore, cladding layers for blue LEDs should have an indium molar fraction of less than 0.17. See K. S. Kim, A. Saxler, P. Kung, M. Razeghi, and K. Y. Kim, Appl. Phys. Lett. 71 800 (1997).

Example 2

Blue light emissions are produced for the ternary $In_xAl_{1-x}N$ between 0.14<x<0.21, with $In_{0.17}Al_{0.83}N$ producing luminescence peaked at 450 nm and $In_{0.22}Al_{0.78}N$ at 500 nm. See S. Yamaguchi, M. Kariya, S. Nitta, T. Takeuchi, C. Wetzel, H. Amano, and I. Akasaki, Appl. Phys. Lett. 76 876 (2000). Reducing the indium molar fraction to less than 0.14 will produce light at shorter wavelengths, thereby permitting emissions of 425 nm. For green emission (e.g., 500<$\lambda$<575 nm), the indium molar fraction should be between about 0.22<x<0.35.

It will be understood by those of skill in the art that these are bulk emission values and that growth of the material as quantum wells will produce quantum confinement that will blue shift these emission wavelengths.

It will be further appreciated by those of ordinary skill in the art that, as used herein, the concept of one layer being "between" two other layers does not necessarily imply that the three layers are contiguous (i.e., in intimate contact). Rather, as used herein the concept of one layer being between two other layers is meant to describe the relative positions of the layers within the semiconductor structure. Similarly, as used herein, the concept of a first layer being in contact with a second layer, "opposite" a third layer, merely describes the relative positions of the first and second layers within the semiconductor structure.

That said, in preferred embodiments of the semiconductor structure, the active layer 13 has a first surface 14 contiguous to the first cladding layer 11 and a second surface 15 contiguous to the second cladding layer 12. In other words, in such embodiments, the active layer 13 is sandwiched directly between the first cladding layer 11 and the second cladding layer 12, with no additional layers disturbing this three-layer double heterostructure, which is designated by the brackets 16.

The structural designation "double heterostructure" is used herein in a manner well understood in this art. Aspects of these structures are discussed, for example, in Sze, *Physics of Semiconductor Devices*, Second Edition (1981) at pages 708–710. Although the cited Sze discussion refers to lasers, it nonetheless illustrates the nature of, and the distinction between, homostructure, single heterostructure, and double heterostructure devices.

The semiconductor device 10 can further comprise a silicon carbide substrate 17 that has the same conductivity type as first cladding layer 11. The silicon carbide substrate 17 preferably has a polytype of 3C, 4H, 6H, or 15R. The first cladding layer 11 is positioned between the silicon carbide substrate 17 and the active layer 13.

Figure 3:
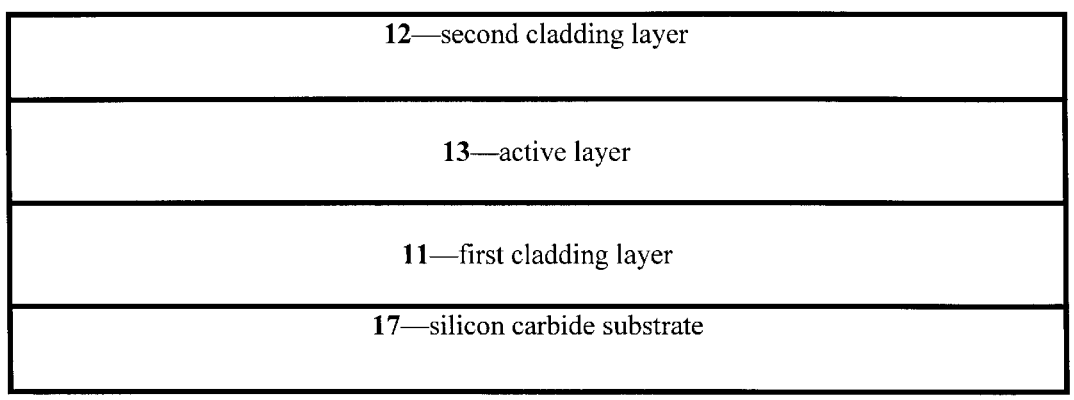
FIG. 3 is a cross-sectional schematic view of an embodiment of the semiconductor structure.

In another embodiment of the invention depicted by FIG. 3, the silicon carbide substrate 17 is in contact with the first cladding layer 11, opposite the active layer 13 (i.e., there are no intervening layers between silicon carbide substrate 17 and first cladding layer 11).

The silicon carbide substrate 17 is most preferably a single crystal. As is well understood by those of ordinary skill in this art, a high quality single crystal substrate provides a number of structural advantages that in turn provide significant performance and lifetime advantages. The silicon carbide substrate 17 can be formed by the methods described in U.S. Pat. No. 4,866,005 (now U.S. Pat.

No. RE 34,861), which is commonly assigned with the pending application. Preferably, the silicon carbide substrate 17 and the first cladding layer 11 are n-type because high-quality, silicon carbide single crystal substrates have been somewhat easier to produce as n-type.

Figure 4:
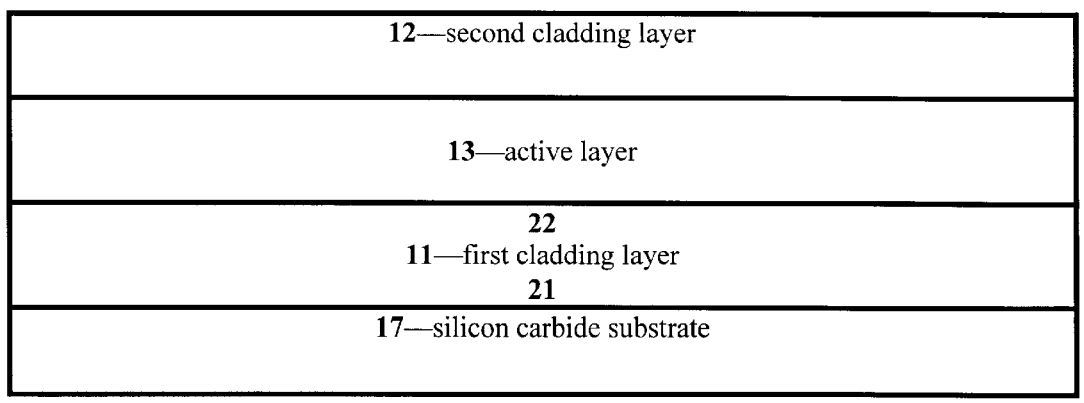
FIG. 4 is a cross-sectional schematic view of an embodiment of the semiconductor structure.

In a preferred embodiment depicted by FIG. 4, the first cladding layer 11 has a first surface 21 that is in contact with the silicon carbide substrate 17 and a second surface 22 that is in contact with the active layer 13. In particular, the composition of the first cladding layer 11 is progressively graded such that the crystal lattice at its first surface 21 more closely matches the crystal lattice of the silicon carbide 17, and the crystal lattice at its second surface 22 more closely matches the crystal lattice of the active layer 13. A sufficient mole fraction of indium must be present in the first cladding layer 11 to ensure that it remains conductive at its first surface 21, adjacent to the silicon carbide substrate 17.

As used herein, the concept of more closely matching respective crystal lattices does not imply perfect matching, but rather that a layer composition has been progressively graded so that its lattice at a layer interface is more compatible with the crystal lattice of the adjacent layer. When fabricating devices, a number of considerations must be balanced, one of which is lattice matching. If other factors are more important, a perfect or close lattice match may be less important and vice versa.

In this regard, cladding layers, especially aluminum indium nitride cladding layers, can be selectively lattice matched to gallium-containing active layers, especially gallium nitride and indium gallium nitride active layers, in order to reduce strain and defects. In particular, aluminum indium nitrides are useful because they can be lattice matched to other Group III nitrides with higher bandgaps. See FIG. 2.

As will be understood by those having ordinary skill in the art, lattice matching of the cladding layers and the active layer can be a one-sided lattice match (i.e., where a lattice match occurs on one side of the active layer) or a two-sided lattice match (i.e., where a lattice match occurs on both sides of the active layer).

Figure 5:
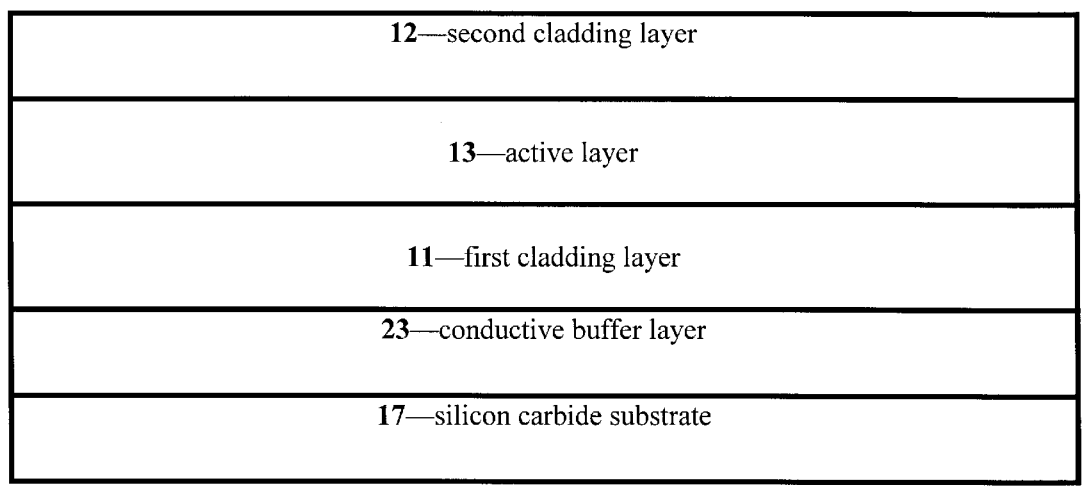
FIG. 5 is a cross-sectional schematic view of an embodiment of the semiconductor structure.

In another embodiment depicted by FIG. 5, the semiconductor structure 10 further includes a conductive buffer layer 23 positioned between the silicon carbide substrate 17 and the first cladding layer 11. In a variant of this embodiment, the conductive buffer layer 23 is sandwiched between the silicon carbide substrate 17 and the first cladding layer 11, with no intervening layers. The conductive buffer layer 23 preferably consists essentially of aluminum gallium nitride having the formula $Al_xGa_{1-x}N$, where $0 \leq x \leq 1$. Alternatively, when the first cladding layer 11 consists essentially of aluminum indium nitride having the formula, $Al_xIn_{1-x}N$, where $0<x \leq 1$, the conductive buffer layer 23 preferably consists essentially of aluminum indium nitride having the formula, $Al_xIn_{1-x}N$, where $0 \leq x \leq 1$. Other acceptable buffers and buffer structures include those described in commonly assigned U.S. Pat. Nos. 5,523,589, 5,393,993, and 5,592,501, the contents of each hereby being incorporated entirely herein by reference.

Figure 6:
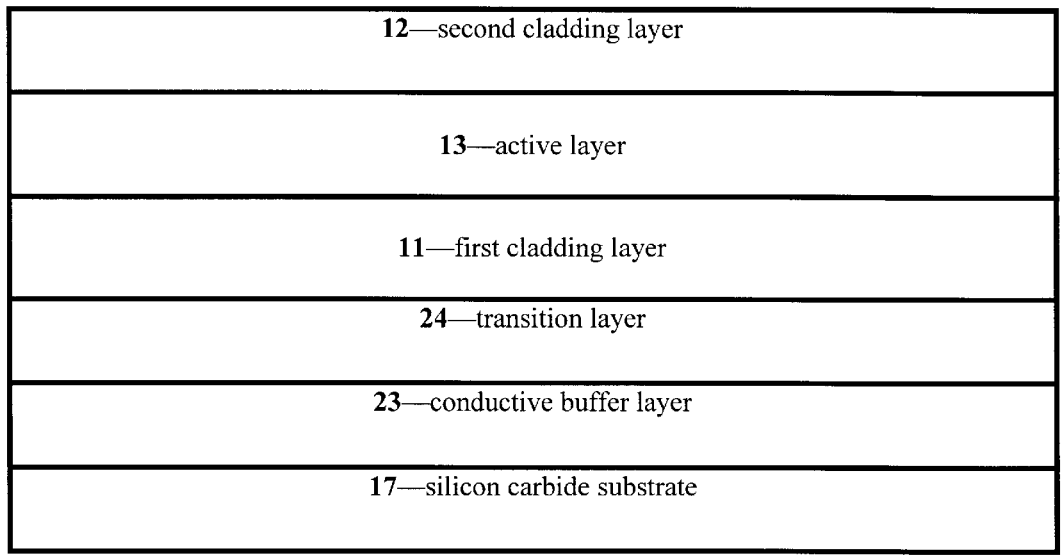
FIG. 6 is a cross-sectional schematic view of an embodiment of the semiconductor structure.

To facilitate the transition between the first cladding layer 11 and the conductive buffer layer 23, the semiconductor structure 10 can further include a Group III nitride transition layer 24, preferably formed of a compositionally graded layer that is positioned between the conductive buffer layer 23 and the first cladding layer 11. The transition layer 24 has the same conductivity type as the first cladding layer 11 and the silicon carbide substrate 17. See FIG. 6.

Figure 7:
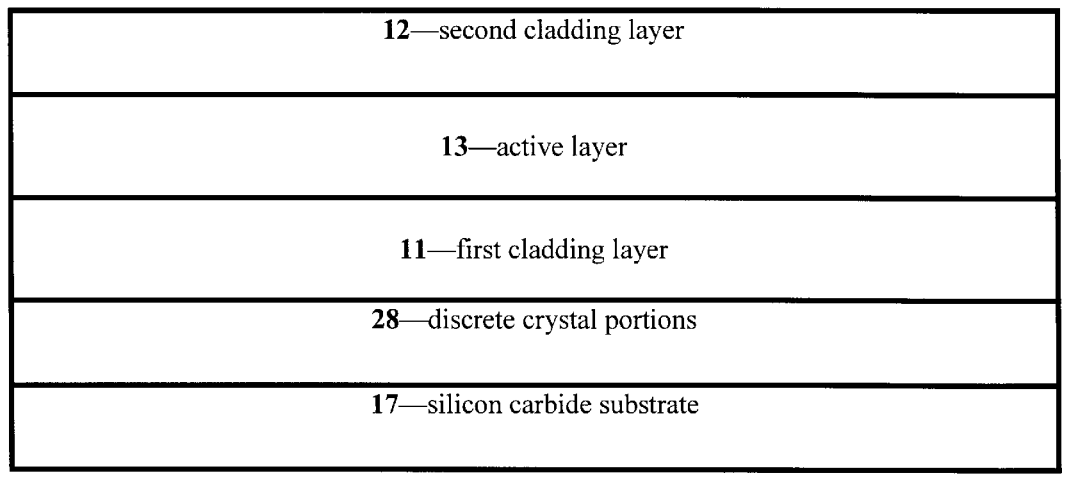
FIG. 7 is a cross-sectional schematic view of an embodiment of the semiconductor structure.

Alternatively, as depicted by FIG. 7, the conductive buffer layer 23 and transition layer 24 can be replaced by discrete crystal portions 28 (i.e., i.e., Group III nitride dots, preferably gallium nitride dots or indium gallium nitride dots) separating the first cladding layer 11 and the silicon carbide substrate 17. In such an embodiment, the discrete crystal portions 28 are present in an amount sufficient to minimize or eliminate the barrier between the first cladding layer 11 and the silicon carbide substrate 17, but less than the amount that would detrimentally affect or destroy the function of any resulting light emitting device formed on the silicon carbide substrate 17.

Moreover, in another embodiment the discrete crystal portions 28 may be positioned between the silicon carbide substrate 17 and the conductive buffer layer 23. FIG. 1 broadly illustrates the relative positions of the conductive buffer layer 23, the transition layer 24, and the discrete crystal portions 28 when one of more of these components are present in the semiconductor structure.

The discrete crystal portions do not form an epitaxial layer. Accordingly, those of ordinary skill in the art will understand that the depiction of the discrete crystal portions 28 in FIG. 1 and FIG. 7 is merely schematic.

Preferably, the discrete crystal portions 28 are formed from gallium nitride or indium gallium nitride.

The inclusion of such discrete crystal portions of gallium nitride is disclosed more fully in commonly assigned U.S. patent application Ser. No. 08/944,547, filed Oct. 7, 1997, for "Group III Nitride Photonic Devices on Silicon Carbide Substrates with Conductive Buffer Interlayer Structure," which is incorporated entirely herein by reference.

In yet another embodiment, the semiconductor structure 10 further includes a first ohmic contact 25 and a second ohmic contact 26. As indicated in FIG. 1, the first ohmic contact 25 is positioned in the semiconductor structure such that the silicon carbide substrate 17 is between the first ohmic contact 25 and the first cladding layer 11. The second ohmic contact 26 is positioned in the semiconductor structure such that the second cladding layer 12 is between the second ohmic contact 26 and the active layer 13. See FIG. 1.

The semiconductor structure 10 may further include a Group III nitride contact layer 27 positioned between the second ohmic contact 26 and the second cladding layer 12. The contact layer 27 and the second cladding layer 12 have the same conductivity type, typically p-type. See FIG. 1.

In preferred embodiments, the contact layer is p-type and is made of gallium nitride(preferably magnesium-doped gallium nitride); indium nitride; aluminum indium nitride of the formula $Al_xIn_{1-x}N$, where $0<x<1$; aluminum gallium nitride of the formula $Al_xGa_{1-x}N$, where $0<x<1$; indium gallium nitride of the formula $In_xGa_{1-x}N$, where $0<x<1$; or $Al_xIn_yGa_{1-x-y}N$ where $0<x<1$ and $0<y<1$ and $(x+y)<1$. In this regard, the exclusion of both 0 and 1 from the range requires the presence of both Group III elements in the alloy.

In a most preferred embodiment, the contact layer is a p-type contact layer comprising a superlattice formed from a plurality of Group III nitride layers selected from the group consisting of gallium nitride (preferably magnesium-doped gallium nitride); indium nitride; aluminum indium nitride of the formula $Al_xIn_{1-x}N$, where $0<x<1$; aluminum gallium nitride of the formula $Al_xGa_{1-x}N$, where $0<x<1$; indium gallium nitride of the formula $In_xGa_{1-x}N$, where $0<x<1$; and $Al_xIn_yGa_{1-x-y}N$, where $0<x<1$ and $0<y<1$ and $(x+y)<1$.

In particular, the superlattice is best formed from alternating layers of any two of these Group III nitride layers. In such a superlattice, alternating layers of any two of gallium nitride, aluminum indium nitride, an indium gallium nitride are most preferred More generally, it is preferable to incorporate in the superlattice structure at least one layer of indium nitride, aluminum indium nitride, indium gallium nitride, or aluminum indium gallium nitride (i.e., the superlattice should not be formed from only gallium nitride layers). Aluminum gallium nitride layers are somewhat less favored. For example, a superlattice formed from a plurality of contiguous p-type Group III nitride layers selected from the group consisting of gallium nitride, aluminum indium nitride, indium gallium nitride is especially desirable, provided at least one contiguous p-type Group III nitride layer is either aluminum indium nitride or indium gallium nitride.

Preferably, the first ohmic contact 25 is placed directly on the silicon carbide substrate 17, opposite the first cladding layer 11, and the second ohmic contact 26 is placed directly on the Group III nitride contact layer 27, opposite the second cladding layer 12. In a variant of this embodiment, the contact layer 27 is sandwiched between the second ohmic contact 26 and the second cladding layer 12, with no intervening layers.

As recognized by those of ordinary skill in this art, the buffer layer 23 provides a physical and electronic transition between the silicon carbide substrate 17 and the first cladding layer 11. In many circumstances, the presence of the buffer layer 23 helps ease the physical strain that can result from the lattice differences between the silicon carbide substrate 17 and the first cladding layer 11. Furthermore, to preserve the vertical function of the device, the buffer layer 23 has to be sufficiently conductive to carry the desired or required current to operate the device 10. Likewise, the transition layer 24 serves a similar physical and electronic transition.

The ohmic contacts 25 and 26, which complete the advantageous vertical structure of the invention, are preferably formed of a metal such as aluminum (Al), nickel (Ni), titanium (Ti), gold (Au), platinum (Pt), vanadium (V), alloys, or blends thereof, or sequential layers of two or more of these metals, but also may be formed of other ohmic contact materials known by those skilled in the art provided that they exhibit ohmic character and do not otherwise interfere with the structure or function of the LED 10.

To the extent the ohmic contact 25 is formed to the silicon carbide substrate 17, the invention is distinguished from those devices that employ sapphire. Sapphire cannot be made conductive, and so cannot be connected to an ohmic contact. Consequently, sapphire-based devices cannot be formed into the kinds of vertical structures that are most preferred for LEDs.

Accordingly, in one preferred embodiment the invention is a semiconductor structure for light emitting devices that includes a single crystal silicon carbide substrate 17 of a 3C, 4H, 6H, or 15R polytype, an active layer 13 of $Al_xIn_yGa_{1-x-y}N$, where $0 \leq x \leq 1$ and $0 \leq y \leq 1$ and $(x+y) \leq 1$, a gallium-free first cladding layer 11 consisting essentially of $Al_xIn_{1-x}N$, where $0 < x \leq 1$, and a second cladding layer 12 of $Al_xIn_yGa_{1-x-y}N$, where $0 \leq x \leq 1$ and $0 \leq y \leq 1$ and $(x+y) \leq 1$.

In another preferred embodiment, the invention is a semiconductor structure for light emitting devices that includes a single crystal silicon carbide substrate 17 of a 3C, 4H, 6H, or 15R polytype, a gallium-free active layer 13 consisting essentially of $Al_xIn_{1-x}N$, where $0 \leq x < 1$, a first cladding layer 11 of $Al_xIn_yGa_{1-x-y}N$, where $0 \leq x \leq 1$ and $0 \leq y \leq 1$ and $(x+y) \leq 1$, and a second cladding layer 12 of $Al_xIn_yGa_{1-x-y}N$, where $0 \leq x \leq 1$ and $0 \leq y \leq 1$ and $(x+y) \leq 1$.

In each of these embodiments, the first cladding layer 11 is positioned between the silicon carbide substrate 17 and the active layer 13, and the second cladding layer 12 is positioned in the semiconductor structure such that the active layer 13 is between the first cladding layer 11 and the second cladding layer 12. Moreover, as in the other disclosed embodiments of the invention, the first cladding layer 11 and the silicon carbide substrate 17 have the same conductivity type, preferably opposite the conductivity type of the second cladding layer 12. Finally, the respective bandgaps of the first cladding layer 11 and the second cladding layer 12 are each larger than the bandgap of the active layer 13.

In either of these embodiments, the composition of the first cladding layer 11 can be progressively graded such that the crystal lattice at its first surface 21 more closely matches the crystal lattice of the silicon carbide 17, and the crystal lattice at its second surface 22 more closely matches the crystal lattice of the active layer 13.

Furthermore, and in accordance with the previous descriptions, either of these preferred structures may also include one or more of the following layers—the conductive buffer layer 23, the Group III nitride transition layer 24, the Group III nitride contact layer 27, and the ohmic contacts 25 and 26. In this regard, the conductive buffer layer 18 most preferably is aluminum gallium nitride having the formula $Al_xGa_{1-x}N$, where $0 \leq x \leq 1$, or aluminum indium nitride having the formula $Al_xIn_{1-x}N$, where $0 \leq x \leq 1$.

In the drawings and the specification, typical embodiments of the invention have been disclosed. Specific terms have been used only in a generic and descriptive sense, and not for purposes of limitation. The scope of the invention is set forth in the following claims.

That which is claimed is:

1. A semiconductor structure for light emitting devices that can emit in the red to ultraviolet portion of the electromagnetic spectrum, said structure comprising:

a silicon carbide substrate;

a first cladding layer of $Al_xIn_yGa_{1-x-y}N$, where $0 \leq x \leq 1$ and $0 \leq y < 1$ and $(x+y) \leq 1$;

a second cladding layer of $Al_xIn_yGa_{1-x-y}N$, where $0 \leq x \leq 1$ and $0 \leq y < 1$ and $(x+y) \leq 1$;

an active layer of $Al_xIn_yGa_{1-x-y}N$, where $0 \leq x < 1$ and $0 \leq y \leq 1$ and $0 \leq (x+y) \leq 1$, wherein said first cladding layer is positioned between said silicon carbide substrate and said active layer, and said active layer is positioned between said first cladding layer and said second cladding layer;

a first ohmic contact, wherein said silicon carbide substrate is positioned between said first ohmic contact and said first cladding layer;

a second ohmic contact, wherein said second cladding layer is positioned between said second ohmic contact and said active layer; and a Group III nitride contact layer, wherein said contact layer is positioned between said second ohmic contact and said second cladding layer, and said contact layer and said second cladding layer have the same conductivity type;

wherein said first and second cladding layers have respective bandgaps that are each larger than the bandgap of said active layer; and wherein at least one of the layers selected from the group consisting of said first cladding layer, said second cladding layer, and said active layer is characterized by the absence of gallium.

2. A semiconductor structure according to claim 1, wherein said silicon carbide substrate is a single crystal silicon carbide substrate of a polytype selected from the group consisting of 3C, 4H, 6H, and 15R, said silicon carbide substrate having a distinct conductivity type.

3. A semiconductor structure according to claim 1, wherein said first and second ohmic contacts comprise at least one metal selected from the group consisting of aluminum, nickel, titanium, gold, platinum, and vanadium, and layers, alloys, and blends thereof.

4. A semiconductor structure according to claim 1, wherein:
said first ohmic contact is in contact with said silicon carbide substrate, opposite said first cladding layer; and
said second ohmic contact is in contact with said contact layer, opposite said second cladding layer.

5. A semiconductor structure according to claim 1, wherein said contact layer is a p-type contact layer formed of a Group III nitride selected from the group consisting of gallium nitride, indium nitride, $Al_xIn_{1-x}N$, where $0<x<1$, $Al_xGa_{1-x}N$, where $0<x<1$, $In_xGa_{1-x}N$, where $0<x<1$, and $Al_xIn_yGa_{1-x-y}N$, where $0<x<1$ and $0<y<1$ and $(x+y)<1$.

6. A semiconductor structure according to claim 1, wherein said contact layer is a p-type superlattice formed from a plurality of Group III nitride layers selected from the group consisting of gallium nitride, indium nitride, $Al_xIn_{1-x}N$, where $0<x<1$, $Al_xGa_{1-x}N$, where $0<x<1$, $In_xGa_{1-x}N$, where $0<x<1$, and $Al_xIn_yGa_{1-x-y}N$, where $0<x<1$ and $0<y<1$ and $(x+y)<1$.

7. A semiconductor structure according to claim 6, wherein said superlattice is formed from alternating layers of two Group III nitride layers selected from the group consisting of gallium nitride, indium nitride, $Al_xIn_{1-x}N$, where $0<x<1$, $Al_xGa_{1-x}N$, where $0<x<1$, $In_xGa_{1-x}N$, where $0<x<1$, and $Al_xIn_yGa_{1-x-y}N$, where $0<x<1$ and $0<y<1$ and $(x+y)<1$.

8. A semiconductor structure according to claim 7, wherein said superlattice is formed from a plurality of alternating layers of gallium nitride and $In_xGa_{1-x}N$, where $0<x<1$.

9. A semiconductor structure according to claim 7, wherein said superlattice is formed from a plurality of alternating layers of gallium nitride and $Al_xGa_{1-x}N$, where $0<x<1$.

10. A semiconductor structure according to claim 1, wherein said contact layer has a first surface and a second surface, said first surface of said contact layer being in contact with said second cladding layer, opposite said active layer, and said second surface of said contact layer being in contact with said second ohmic contact.

11. A semiconductor structure for light emitting devices that can emit in the red to ultraviolet portion of the electromagnetic spectrum, said structure comprising:
a silicon carbide substrate;
a first cladding layer of $Al_xIn_yGa_{1-x-y}N$, where $0 \leq x \leq 1$ and $0 \leq y<1$ and $(x+y) \leq 1$;
a second cladding layer of $Al_xIn_yGa_{1-x-y}N$, where $0 \leq x \leq 1$ and $0 \leq y<1$ and $(x+y) \leq 1$;
an active layer of $Al_xIn_yGa_{1-x-y}N$, where $0 \leq x<1$ and $0 \leq y \leq 1$ and $0 \leq (x+y) \leq 1$, wherein said first cladding layer is positioned between said silicon carbide substrate and said active layer, and said active layer is positioned between said first cladding layer and said second cladding layer;
a Group III nitride p-type superlattice contact layer, wherein said superlattice contact layer and said second cladding layer have the same conductivity type;
a first ohmic contact, wherein said silicon carbide substrate is positioned between said first ohmic contact and said first cladding layer; and
a second ohmic contact, wherein said superlattice contact layer is positioned between said second cladding layer and said second ohmic contact;
wherein said first and second cladding layers have respective bandgaps that are each larger than the bandgap of said active layer; and
wherein at least one of the layers selected from the group consisting of said first cladding layer, said second cladding layer, and said active layer is characterized by the absence of gallium.

12. A semiconductor structure according to claim 11, wherein said silicon carbide substrate is a single crystal silicon carbide substrate of a polytype selected from the group consisting of 3C, 4H, 6H, and 15R, said silicon carbide substrate having a distinct conductivity type.

13. A semiconductor structure according to claim 11, wherein said silicon carbide substrate and said first cladding layer have the same conductivity type.

14. A semiconductor structure according to claim 11, wherein said superlattice contact layer is formed from a plurality of Group III nitride layers selected from the group consisting of gallium nitride, indium nitride, $Al_xIn_{1-x}N$, where $0<x<1$, $Al_xGa_{1-x}N$, where $0<x<1$, $In_xGa_{1-x}N$, where $0<x<1$, and $Al_xIn_yGa_{1-x-y}N$, where $0<x<1$ and $0<y<1$ and $(x+y)<1$.

15. A semiconductor structure according to claim 11, wherein said superlattice contact layer is formed from alternating layers of two Group III nitride layers selected from the group consisting of gallium nitride, indium nitride, $Al_xIn_{1-x}N$, where $0<x<1$, $Al_xGa_{1-x}N$, where $0<x<1$, $In_xGa_{1-x}N$, where $0<x<1$, and $Al_xIn_yGa_{1-x-y}N$, where $0<x<1$ and $0<y<1$ and $(x+y)<1$.

16. A semiconductor structure according to claim 11, further comprising a conductive buffer layer positioned between said silicon carbide substrate and said first cladding layer.

17. A semiconductor structure for light emitting devices that can emit in the red to ultraviolet portion of the electromagnetic spectrum, said structure comprising:
a silicon carbide substrate;
a first cladding layer consisting essentially of $Al_xIn_{1-x}N$, where $0<x \leq 1$, and that is characterized by the absence of gallium;
a second cladding layer of $Al_xIn_yGa_{1-x-y}N$, where $0 \leq x \leq 1$ and $0 \leq y<1$ and $(x+y) \leq 1$; and
an active layer of $Al_xIn_yGa_{1-x-y}N$, where $0 \leq x<1$ and $0 \leq y \leq 1$ and $(x+y) \leq 1$, wherein said first cladding layer is positioned between said silicon carbide substrate and said active layer, and said active layer is positioned between said first cladding layer and said second cladding layer;
a Group III nitride p-type superlattice contact layer formed from a plurality of Group III nitride layers selected from the group consisting of gallium nitride, indium nitride, $Al_xIn_{1-x}N$, where $0<x<1$, $Al_xGa_{1-x}N$, where $0<x<1$, $In_xGa_{1-x}N$, where $0<x<1$, and $Al_xIn_yGa_{1-x-y}N$, where $0<x<1$ and $0<y<1$ and $(x+y)<1$, wherein said superlattice contact layer and said second cladding layer have the same conductivity type;
a first ohmic contact, wherein said silicon carbide substrate is positioned between said first ohmic contact and said first cladding layer; and
a second ohmic contact, wherein said superlattice contact layer is positioned between said second cladding layer and said second ohmic contact;
wherein said first and second cladding layers have respective bandgaps that are each larger than the bandgap of said active layer.

18. A semiconductor structure according to claim 17, wherein said silicon carbide substrate is a single crystal silicon carbide substrate of a polytype selected from the group consisting of 3C, 4H, 6H, and 15R, said silicon carbide substrate having a distinct conductivity type.

19. A semiconductor structure according to claim 17, wherein:

said first ohmic contact is in contact with said silicon carbide substrate, opposite said first cladding layer; and said second ohmic contact is in contact with said superlattice contact layer, opposite said second cladding layer.

20. A semiconductor structure according to claim 17, wherein said superlattice contact layer is formed from alternating layers of two Group III nitride layers selected from the group consisting of gallium nitride, indium nitride, $Al_xIn_{1-x}N$, where $0<x<1$, $Al_xGa_{1-x}N$, where $0<x<1$, $In_xGa_{1-x}N$, where $0<x<1$, and $Al_xIn_yGa_{1-x-y}N$, where $0<x<1$ and $0<y<1$ and $(x+y)<1$.

21. A semiconductor structure for light emitting devices that can emit in the red to ultraviolet portion of the electromagnetic spectrum, said structure comprising:

a silicon carbide substrate;

a first cladding layer of $Al_xIn_yGa_{1-x-y}N$, where $0 \leq x \leq 1$ and $0 \leq y < 1$ and $(x+y) \leq 1$;

a second cladding layer of $Al_xIn_yGa_{1-x-y}N$, where $0 \leq x \leq 1$ and $0 \leq y < 1$ and $(x+y) \leq 1$;

an active layer consisting essentially of $Al_xIn_{1-x}N$, where $0 \leq x < 1$, and that is characterized by the absence of gallium, wherein said first cladding layer is positioned between said silicon carbide substrate and said active layer, and said active layer is positioned between said first cladding layer and said second cladding layer;

a Group III nitride p-type superlattice contact layer formed from a plurality of Group III nitride layers selected from the group consisting of gallium nitride, indium nitride, $Al_xIn_{1-x}N$, where $0<x<1$, $Al_xGa_{1-x}N$, where $0<x<1$, $In_xGa_{1-x}N$, where $0<x<1$, and $Al_xIn_yGa_{1-x-y}N$, where $0<x<1$ and $0<y<1$ and $(x+y)<1$, wherein said superlattice contact layer and said second cladding layer have the same conductivity type;

a first ohmic contact, wherein said silicon carbide substrate is positioned between said first ohmic contact and said first cladding layer; and a second ohmic contact, wherein said superlattice contact layer is positioned between said second cladding layer and said second ohmic contact;

wherein said first and second cladding layers have respective bandgaps that are each larger than the bandgap of said active layer.

22. A semiconductor structure according to claim 21, wherein said silicon carbide substrate is a single crystal silicon carbide substrate of a polytype selected from the group consisting of 3C, 4H, 6H, and 15R, said silicon carbide substrate having a distinct conductivity type.

23. A semiconductor structure according to claim 21, wherein:

said first ohmic contact is in contact with said silicon carbide substrate, opposite said first cladding layer; and said second ohmic contact is in contact with said superlattice contact layer, opposite said second cladding layer.

24. A semiconductor structure according to claim 21, wherein said superlattice contact layer is formed from alternating layers of two Group III nitride layers selected from the group consisting of gallium nitride, indium nitride, $Al_xIn_{1-x}N$, where $0<x<1$, $Al_xGa_{1-x}N$, where $0<x<1$, $In_xGa_{1-x}N$, where $0<x<1$, and $Al_xIn_yGa_{1-x-y}N$, where $0<x<1$ and $0<y<1$ and $(x+y)<1$.

25. A semiconductor structure for light emitting devices that can emit in the red to ultraviolet portion of the electromagnetic spectrum, said structure, comprising:

an active layer of $Al_xIn_yGa_{1-x-y}N$, where $0 \leq x < 1$ and $0 \leq y \leq 1$ and $0 \leq (x+y) \leq 1$, said active layer having a first surface and a second surface;

a first cladding layer of $Al_xIn_yGa_{1-x-y}N$, where $0 \leq x \leq 1$ and $0 \leq y < 1$ and $(x+y) \leq 1$, said first cladding layer being in contact with said first surface of said active layer;

a second cladding layer of $Al_xIn_yGa_{1-x-y}N$, where $0 \leq x \leq 1$ and $0 \leq y < 1$ and $(x+y) \leq 1$, said second cladding layer being in contact with said second surface of said active layer, said first cladding layer and said second cladding layer having opposite conductivity types, each of said first and second cladding layers having a respective bandgap that is larger than the bandgap of said active layer;

wherein at least one of the layers selected from the group consisting of said first cladding layer, said second cladding layer, and said active layer is characterized by the absence of gallium;

a Group III nitride transition layer, said transition layer in contact with said first cladding layer and opposite said active layer, and having the same conductivity type as said first cladding layer;

a conductive buffer layer in contact with said gallium nitride transition layer and opposite said first cladding layer, said conductive buffer layer being a Group III nitride selected from the group consisting of aluminum gallium nitride having the formula $Al_xGa_{1-x}N$, where $0 \leq x \leq 1$, and aluminum indium nitride having the formula $Al_xIn_{1-x}N$, where $0 \leq x \leq 1$;

a single crystal silicon carbide substrate in contact with said conductive buffer layer and opposite said gallium nitride transition layer, said silicon carbide substrate having a polytype selected from the group consisting of 3C, 4H, 6H, and 15R, and said silicon carbide substrate and said first cladding layer having the same conductivity type;

a first ohmic contact to said silicon carbide substrate and opposite said conductive buffer layer, said first ohmic contact comprising at least one metal selected from the group consisting of aluminum, nickel, titanium, gold, platinum, and vanadium, and layers, alloys, and blends thereof;

a Group III nitride p-type superlattice contact layer on said second cladding layer and opposite said active layer, said contact layer and said second cladding layer having the same conductivity type, wherein said superlattice is formed from a plurality of Group III nitride layers selected from the group consisting of gallium nitride, indium nitride, $Al_xIn_{1-x}N$, where $0<x<1$, $Al_xGa_{1-x}N$, where $0<x<1$, $In_xGa_{1-x}N$, where $0<x<1$, and $Al_xIn_yGa_{1-x-y}N$, where $0<x<1$ and $0<y<1$ and $(x+y)<1$; and a second ohmic contact to said Group III nitride contact layer and opposite said second cladding layer, said second ohmic contact comprising at least one metal selected from the group consisting of aluminum, nickel, titanium, gold, platinum, and vanadium, and layers, alloys, and blends thereof.

\* \* \* \* \*